(12) United States Patent
Köllmann et al.

(10) Patent No.: US 9,479,141 B2
(45) Date of Patent: Oct. 25, 2016

(54) LOW-PASS FILTER

(71) Applicant: NXP B.V., Eindhoven (NL)

(72) Inventors: Andreas Johannes Köllmann, Hamburg (DE); Steffen Rode, Lüneburg (DE); Joachim Utzig, Hamburg (DE); Joerg Syré, Kölln-Reisiek (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/941,941

(22) Filed: Nov. 16, 2015

(65) Prior Publication Data

US 2016/0149559 A1    May 26, 2016

(30) Foreign Application Priority Data

Nov. 26, 2014  (EP) .................................... 14195003

(51) Int. Cl.
| | | |
|---|---|---|
| *H03K 5/00* | (2006.01) | |
| *H03H 11/12* | (2006.01) | |
| *G05F 1/56* | (2006.01) | |
| *H03H 7/06* | (2006.01) | |
| *H03H 11/24* | (2006.01) | |

(52) U.S. Cl.
CPC ............ *H03H 11/1213* (2013.01); *G05F 1/56* (2013.01); *H03H 7/06* (2013.01); *H03H 11/1217* (2013.01); *H03H 11/245* (2013.01)

(58) Field of Classification Search
CPC ............. H03H 11/0422; H03H 11/04; H03H 11/1291; H03H 11/1213; H03K 5/1252
USPC .................... 327/336–337, 552–559
See application file for complete search history.

(56) References Cited

U.S. PATENT DOCUMENTS

| | | | | |
|---|---|---|---|---|
| 5,999,043 | A  * | 12/1999 | Zhang | ...................... H03H 1/02 327/308 |
| 6,346,851 | B1 * | 2/2002 | Zhang | .................. H03H 11/245 327/336 |
| 7,397,226 | B1 | 7/2008 | Mannama et al. | |
| 8,225,859 | B1 * | 7/2012 | Moidel | ................. E21B 27/005 166/105.1 |
| 8,531,237 | B2 * | 9/2013 | Aisu | ....................... G05F 1/575 323/273 |
| 2011/0012582 | A1 | 1/2011 | Aisu | |
| 2011/0095813 | A1 | 4/2011 | Ozasa et al. | |
| 2014/0049314 | A1 | 2/2014 | Polley | |

FOREIGN PATENT DOCUMENTS

| | | |
|---|---|---|
| EP | 0 849 878 A2 | 6/1988 |
| EP | 2 639 666 A1 | 9/2013 |

OTHER PUBLICATIONS

Annema, Anne-Johan; "Low-Power Bandgap References Featuring DTMOST's"; IEEE Journal of Solid-State Circuits, vol. 34, No. 7; pp. 949-955.

Blauschild, Robert A. et al; "A New NMOS Temperature-Stable Voltage Reference"; IEEE Journal of Solid-State Circuits, vol. SC-13, No. 6; pp. 767-774 (Dec. 1978).

Extended European Search Report for application 14195003.0 (May 11, 2015).

* cited by examiner

*Primary Examiner* — Dinh T Le

(57) ABSTRACT

A low-pass filter comprising: a filter input terminal; a filter output terminal; a filter FET configured to provide a resistance between the filter input terminal and the filter output terminal; a filter capacitor connected between the filter output terminal and a reference terminal; a bias FET configured to provide a bias voltage to the filter FET; a buffer connected between the filter input terminal and the bias FET, the buffer configured to source a bias current for the bias FET; and an offset voltage source configured to contribute to the bias voltage provided to the filter FET.

16 Claims, 3 Drawing Sheets

LOW-PASS FILTER

CROSS-REFERENCE TO RELATED APPLICATIONS

This application claims the priority under 35 U.S.C. §119 of European patent application no. 14195003.0, filed the contents of which are incorporated by reference herein.

The present disclosure relates to low-pass filters, in particular, although not exclusively, to low-pass filters for low noise LDOs (low-dropout regulators).

SUMMARY

According to a first aspect, there is provided a low-pass filter comprising:
- a filter input terminal;
- a filter output terminal;
- a filter FET configured to provide a resistance between the filter input terminal and the filter output terminal;
- a filter capacitor connected between the filter output terminal and a reference terminal;
- a bias FET configured to provide a bias voltage to the filter FET;
- a buffer connected between the filter input terminal and the bias FET, the buffer configured to source a bias current for the bias FET; and
- an offset voltage source configured to contribute to the bias voltage provided to the filter FET.

Use of such a buffer enables the bias current to be sourced in such a way that it does not have to be directly delivered by a reference voltage source that is connected to the filter input terminal. Therefore, sourcing of the bias current does not modify the reference voltage, which would otherwise be a negative side effect.

The offset voltage source may be configured to contribute to a source-gate voltage of the bias FET. In this way, the source-gate voltage of the bias FET may be less than a threshold voltage of the filter FET.

A ratio of the width to the length of the filter FET may be the same or greater than the ratio of the width to the length of the bias FET. The width of the filter FET may be the same as the width of the bias FET. The length of the filter FET may be the same as the length of the bias FET.

The threshold voltages of the filter FET and the bias FET may be different. A threshold voltage of the filter FET may be greater than a thresholds voltage of the bias FET.

The filter FET and the bias FET may be different types of transistors. A well of the filter FET and a well of the bias FET may be connected to different potentials. The filter FET and the bias FET may have gate oxide layers with different thicknesses. The filter FET and the bias FET may be suitable for different voltage domains. The filter FET and the bias FET may have different types and/or amounts of implants that are present in the substrate or well that forms the device.

The filter FET and the bias FET may be the same type of transistors.

The wells of the filter FET and the bias FET may be connected to different potentials. A well of the bias FET may be connected to the gate of the bias FET. The bias FET and the filter FET may have the same or different geometries. The ratio of the width to the length of the filter FET can be different to the ratio of the width to the length of the bias FET.

The offset voltage source may be provided inside the buffer. The buffer may comprise a differential input stage comprising a first buffer FET and a second buffer FET. A threshold voltage of the first buffer FET may be different to a threshold voltage of the second buffer FET.

The first buffer FET and the second buffer FET may be different types of transistors. The first buffer FET and the second buffer FET may have gate oxide layers with different thicknesses. The first buffer FET and the second buffer FET may be suitable for different voltage domains. The first buffer FET and the second buffer FET may be configured to receive different supply voltage levels. The first buffer FET and the second buffer FET may have different types and/or amounts of implants that are present in the substrate that forms the device. The first buffer FET and the second buffer FET may have different threshold voltages.

The first buffer FET and the second buffer FET may be the same type of transistors.

The well of the first buffer FET and the second buffer FET may be connected to different potentials. A well of the second buffer FET may be connected to the gate of the second buffer FET. The second buffer FET and the first buffer FET may have the same or different geometries. The ratio of the width to the length of the first buffer FET can be different to the ratio of the width to the length of the second buffer FET.

The filter FET may comprise a filter FET conduction channel and a filter FET control terminal. The filter FET conduction channel may be connected in series between the filter input terminal and the filter output terminal.

The bias FET may comprise: a bias FET control terminal; and a bias FET conduction channel between a first bias FET conduction terminal and a second bias FET conduction terminal. The bias FET control terminal may be connected to the filter FET control terminal.

The filter may further comprise a bias current source configured to provide a bias current to the bias FET. The bias current source may be connected to the first bias FET conduction terminal, the bias FET control terminal and the filter FET control terminal. The offset voltage source may be connected to the second bias FET conduction terminal.

The offset voltage, or another offset voltage source, may be connected in series between the buffer output terminal and the second buffer input terminal.

The buffer may comprise a first buffer input terminal, a second buffer input terminal and a buffer output terminal. The first buffer input terminal may be connected to the filter input terminal. The buffer output terminal may be connected to the second buffer input terminal. The offset voltage source may be connected in series between buffer output terminal and the second bias FET conduction terminal.

There may be provided a low-pass filter comprising;
- a filter input terminal;
- a filter output terminal;
- a filter FET configured to provide a resistance between the filter input terminal and the filter output terminal;
- a filter capacitor connected between the filter output terminal and a reference terminal;
- a bias FET configured to provide a bias voltage to the filter FET; and
- an offset voltage source configured to contribute to the bias voltage provided to the filter FET;

wherein the filter FET and the bias FET are different types of transistors, or wherein a well of the filter FET and a well of the bias FET are connected to different potentials.

The filter FET and the bias FET may have gate oxide layers with different thicknesses. The filter FET and the bias FET may be suitable for different voltage domains. The filter FET and the bias FET may have different types and/or amounts of implants that are present in the substrate or well that forms the device. The filter FET and the bias FET may have different threshold voltages.

The offset voltage source may be configured to contribute to a source-gate voltage of the bias FET such that the source-gate voltage of the bias FET is less than a threshold voltage of the filter FET.

The ratio of the width to the length of the filter FET may be the same or greater than the ratio of the width to the length of the bias FET. The width of the filter FET may be the same as the width of the bias FET. The length of the filter FET may be the same as the length of the bias FET.

A threshold voltage of the filter FET may be greater than a threshold voltage of the bias FET.

The filter may further comprise a buffer connected between the filter input terminal and the bias FET. The buffer may be configured to source a bias current for the bias FET.

The offset voltage source may be provided inside the buffer. The buffer may comprise a differential input stage comprising a first buffer FET and a second buffer FET. A threshold voltage of the first buffer FET may be different to a threshold voltage of the second buffer FET.

The first buffer FET and the second buffer FET may be the same type of transistors. The well of the first buffer FET and the second buffer FET may be connected to different potentials. A well of the second buffer FET may be connected to the gate of the second buffer FET. The second buffer FET and the first buffer FET may have the same or different geometries.

The filter FET may comprise a filter FET conduction channel and a filter FET control terminal. The filter FET conduction channel may be connected in series between the filter input terminal and the filter output terminal.

The bias FET may comprise: a bias FET control terminal; and a bias FET conduction channel between a first bias FET conduction terminal and a second bias FET conduction terminal. The bias FET control terminal may be connected to the filter FET control terminal.

The filter may further comprise a bias current source configured to provide a bias current to the bias FET. The bias current source may be connected to the second bias FET conduction terminal, the bias FET control terminal and the filter FET control terminal.

The offset voltage source may be connected to the first bias FET conduction terminal.

The offset voltage source may be connected in series between the buffer output terminal and the second buffer input terminal.

The buffer may comprise a first buffer input terminal, a second buffer input terminal and a buffer output terminal. The first buffer input terminal may be connected to the filter input terminal. The buffer output terminal may be connected to the second buffer input terminal. The offset voltage source may be connected in series between buffer output terminal and the first bias FET conduction terminal.

There may be provided a low-dropout regulator comprising any low-pass filter disclosed herein.

BRIEF DESCRIPTION OF THE DRAWINGS

Embodiments will now be described by way of example with reference to the accompanying figures, in which.

DETAILED DESCRIPTION

Figure 1:
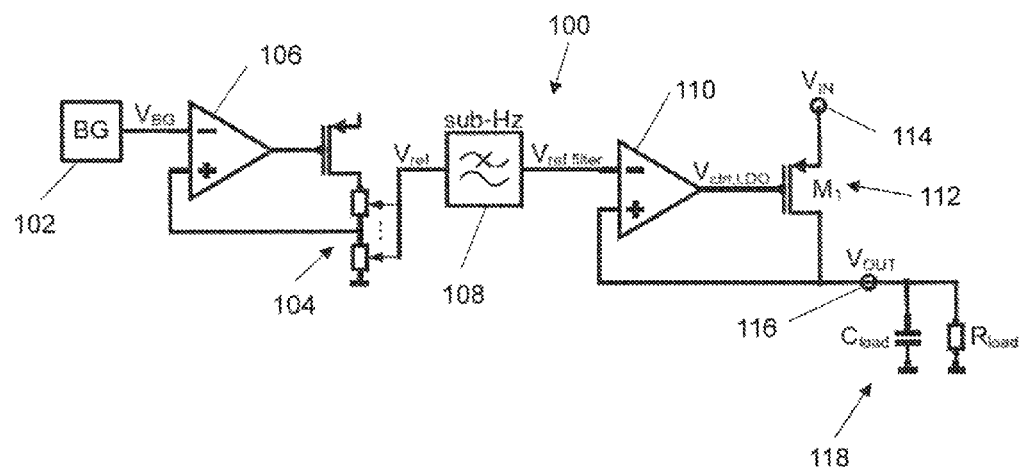
FIG. 1 shows an example architecture of a low noise low-dropout regulator.

FIG. 1 shows an example architecture of a low nose low dropout regulator (LIDO) 100.

A bandgap voltage source 102 is used to generate a reference voltage VBG, which is designed to be as independent of process, temperature or supply voltage as possible. In some examples, but not shown in FIG. 1, a feedback resistive divider can be placed at the output of the regulator to scale up the bandgap voltage towards the desired output voltage. However, as the feedback divider can be one of the major noise contributors, it can be advantageous to remove it from the output.

In the low noise voltage regulator of FIG. 1, the bandgap reference voltage $V_{BG}$ is provided as an input to a scaling amplifier 106, which is configured to scale the bandgap reference voltage $V_{BG}$ to a scaled reference voltage $V_{ref}$. The scaling amplifier 106 includes a control loop that comprises a resistive divider 104. Still, the bandgap voltage source 102, the scaling amplifier 106 and the resistive divider 104 can create significant noise. For this reason, the circuit 100 of FIG. 1 includes a low-pass filter 108, which low-pass filters the scaled reference voltage $V_{ref}$ in order to provide a filtered scaled reference voltage $V_{ref,filter}$. The filtered scaled reference voltage $V_{ref,filter}$ is provided to a first input terminal (in this example the inverting input) of an LDO operational amplifier 110 of the output voltage control loop. The LDO operational amplifier 110 provides an output voltage $V_{ctrl,LDO}$ at its output, which is connected to the gate of an LDO output stage FET 112. The LDO FET 112 also has a conduction channel that is connected between an LDO input terminal 114 and an LDO output terminal 116. The LDO output terminal 116 is also connected to a second input terminal (in this example the non-inverting input) of the LDO operational amplifier 110. The LDO operational amplifier 110 and the LDO FET 112 together provide an LDO. The LDO output terminal 116 can also be connected to a load 118.

To achieve a desired low noise level for sonic applications, the corner frequency of the low-pass filter 108 should be in the sub-Hz frequency range. It may not be feasible or so possible to implement such an ultra-low corner frequency on an acceptably small area of silicon using a simple RC (resistor-capacitor) filter. However, active filter circuits that can implement such low corner frequencies may generate too much noise or consume too much current.

Figure 2A:
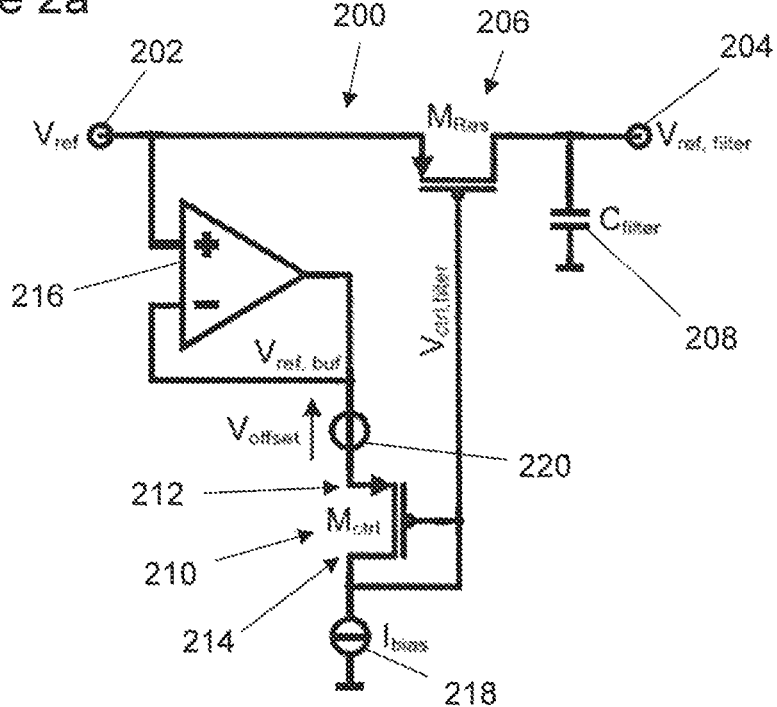
FIGS. 2a and 2b show examples of low-pass filters.
Figure 2B:
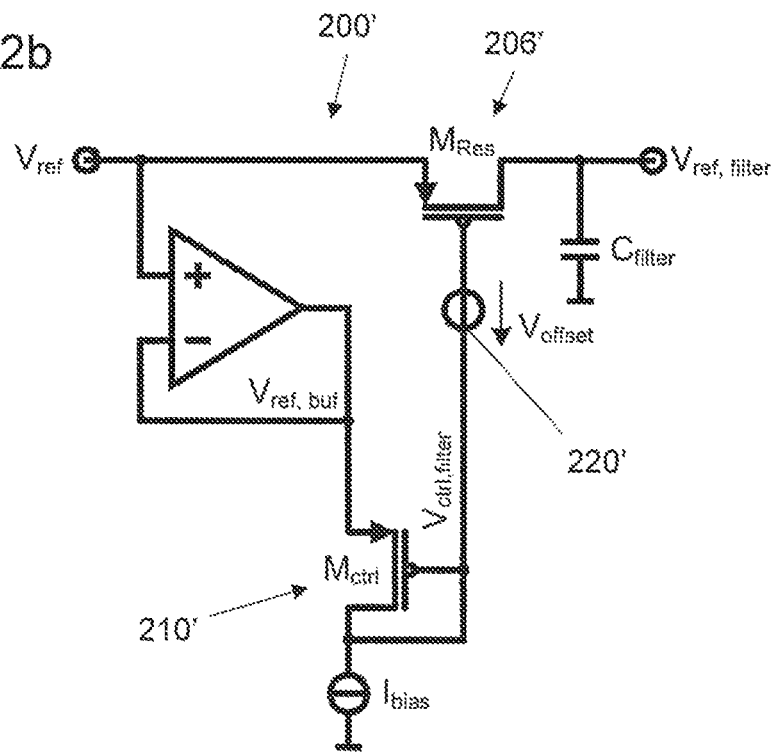
Figure 3:
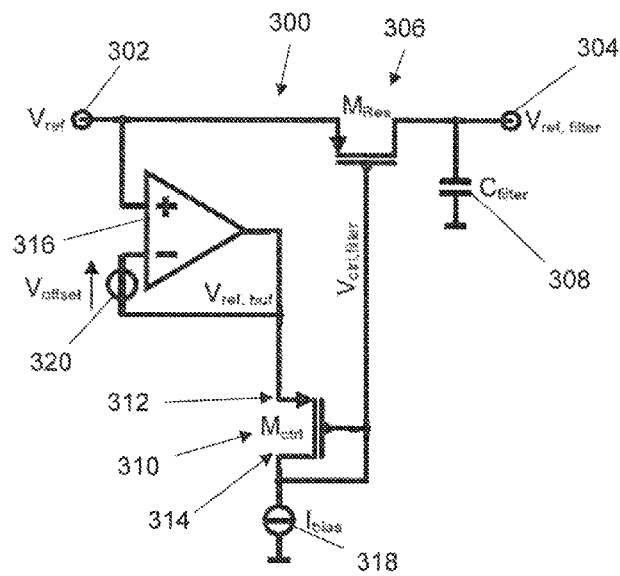
FIG. 3 shows another example of a low-pass filter.

The circuits of FIGS. 2a, 2b and 3 relate to example implementations of a low-pass filter in which a filter FET is used to implement a high-ohmic resistor between a filter input terminal and a filter output terminal, which provides part of the functionality of an RC filter. Also, the circuits can be used to provide a bias voltage or potential for the filter FET that can avoid or reduce design restrictions of the geometry (such as the width and/or length) of the filter FET with reference to another FET, for example a bias FET in the circuit as well as any restrictions in loading the reference voltage delivered to the filter input. Further details are provided below.

FIG. 2a shows a low-pass filter 200 comprising a filter input terminal 202 and a filter output terminal 204. A filter FET 206 (Mres) is configured to provide a resistance between the filter input terminal 202 and the filter output terminal 204. The filter FET 206 comprises a filter FET conduction channel (between the source terminal and the drain terminal) and a filter FET control terminal (the gate terminal). The filter FET conduction channel is connected in series between the filter input terminal 202 and the filter output terminal 204.

The low-pass filter 200 also includes a bias FET 210 (Mctrl) that is configured to provide a bias voltage to the control terminal of the filter FET 206. The filter FET 206 is desirably operated in a high-ohmic state in order to provide a large time constant together with a filter capacitor 208. Any current flowing through the filter FET 206 would change the reference voltage, which would create an unwanted DC-shift between the input and output voltage of the filter and thereby shift the target LDO output voltage. Very little or no current should flow through the filter FET 206. The bias FET 210 includes a bias FET control terminal (the gate terminal) and a bias FET conduction channel. The bias FET conduction channel extends between a first bias FET conduction terminal 212 (the source terminal) and a second bias FET conduction terminal 214 (the drain terminal). The bias FET control terminal is connected to the filter FET control terminal. The second bias FET conduction terminal 214 (the drain terminal) is also connected to the bias FET control terminal.

The low-pass filter 200 also includes the filter capacitor 208 connected between the filter output terminal 204 and a reference terminal. In this example the reference terminal is a ground terminal because the LDO output voltage will also be referenced to ground. It will be appreciated that the LDO output voltage could alternatively be referenced to the supply voltage, in which case the reference terminal for the filter capacitor would be a supply voltage terminal. Also, it will be appreciated that the filter FET 206 and the bias FET 210 can be implemented as NMOS devices (instead of the PMOS devices shown in FIG. 2a) for a supply-referenced scheme.

The filter FET 206 and the filter capacitor 208 together provide the RC low-pass functionality.

The circuit of FIG. 2a also includes a buffer, which in this example is an operational amplifier and will be referred to as the buffer op-amp 216. The buffer op-amp 216 is connected between the filter input terminal 202 and the bias FET 210, and is used to source the bias current for the bias FET 210.

The buffer op-amp 216 advantageously sources the bias current in such a way that it does not have to be delivered by the reference voltage source directly (that is, it is not directly drawn from the filter input terminal 202). Therefore, because of the buffer op-amp 216, the bias current does not modify the reference voltage, which would otherwise be a negative side effect. The voltage at the filter output terminal 204 ($V_{ref,filter}$) is not influenced by the buffer op-amp 216 because the filter FET 206 is directly connected to the voltage signal received at the filter input terminal 202 ($V_{ref}$). Connecting the filter FET 206 to an input of the buffer op-amp 216, as opposed to the output of the buffer op-amp 216 can be advantageous. This is because any offset of the buffer op-amp 216 (intended or due to device or process spread and device mismatch) has little or no impact on the output voltage of the low-pass filter 200 because the offset only modifies the bias voltage Vctrl,filter provided to the filter FET 206 and therefore could potentially modify the filter's RC time constant, but not the DC-value at the filter output terminal 204 of the low-pass filter 200.

The buffer op-amp 216 has a buffer op-amp non-inverting input terminal (which is an example of a first buffer input terminal), a buffer op-amp inverting input terminal (which is an example of a second buffer input terminal) and a buffer op-amp output terminal (which is an example of a buffer output terminal). The buffer op-amp non-inverting input terminal is connected to the filter input terminal 202. The buffer op-amp output terminal is connected to the buffer op-amp inverting input terminal.

A bias current source 218 ($I_{bias}$) is also shown connected between the second bias FET conduction terminal (the drain terminal) and ground.

The bias current source 218 may he active during start-up and also during normal operation. During start-up, the current provided by the start-up bias current source 218 is, in some examples, increased in order to lower the filter FET's 206 on-resistance, thereby resulting in a faster charging of the filter capacitor 208. Advantageously, the presence of the buffer op-amp 216 can prevent a significant modification to the reference voltage at the filter input terminal 202 due to the higher bias current, which otherwise could be detrimental.

in The bias current source 218 can be controlled for startup purpose in a numbers of ways, including:
1. A time constant of, for example, 1 ms can be applied to delay an enable signal until after a "start-up time period" has elapsed. Such an enable signal can be used to turn the circuit on and off. For example, the time constant could be 1 ms for a "start-up time period" of 100 µs. The time constant can be implemented by charging a capacitor of, for example 5 pF, with a small current in the order of a few nA in one example.
2. Using a comparator to compare the output voltage and the input voltage of the filter, wherein the comparison is performed with an offset voltage applied. If the output voltage is significantly below the filters input voltage (for example, is lower by at least the offset voltage or any other threshold value), the start-up bias current source 218 is controlled so as to provide a first bias current level, which can be considered as a high value for start-up. If the output voltage is not significantly below the filter's input voltage (for example, if the difference between the input voltage and the output voltage is less than the offset voltage or any other threshold value), then the start-up bias current source 218 is controlled so as to provide a second bias current level, which can be considered as a low/final value for normal operation. The second bias current level is lower than the first bias current level. The offset voltage can be of the order of a few 10's of millivolts, and can assist in preventing any statistical variations of the comparator leading to a situation where the comparator never flags the final state and therefore the filter FET 206 would never get switched to its high-ohmic sub-Hz mode after start-up.

By adjusting/switching the bias current, the bandwidth of the low-pass filter can be modulated, for example to achieve a higher −3 dB low-pass corner frequency (which may also be referred to as bandwidth in this context) during start-up.

FIG. 2a also shows an offset voltage source 220 associated with the bias FET 210. The offset voltage source 220 of FIG. 2a can be considered as being at the output of the buffer op-amp 216 or inside/associated with the bias FET 210. (It will be appreciated from the description of FIGS. 2b and 3 below that alternatively or additionally an offset voltage source can be associated with other components in the circuit.) The illustrated offset voltage source 220 can be considered as a model that represents how the circuit can be practically implemented, for example with the bias FET 210 and the filter FET 206 having different threshold voltages.

The offset voltage source 220 is configured to provide an offset voltage such that the bias voltage at the gate terminal of the filter FET 206 causes the filter FET 206 to provide a high impedance drain-source resistance ($R_{ds}$). In some examples, the filter capacitor 208 may have a capacitance that is well below 100 pF; it may be of the order of 10-50 pF in some implementations For a 30 pF filter capacitor 208, a required drain-source resistance ($R_{cs}$) of the filter FET 206 could be about 5 GΩ for a 1 Hz low-pass filter.

In this example, the offset voltage source 220 is shown connected to the first bias FET conduction terminal 212 (the source terminal). The circuit aims at shifting up the filter FET's 206 control voltage Vctr,filter (shifting up is appropriate for the example of a PMQS filter FET). The offset voltage source 220 could also be illustrated between the second bias FET conduction terminal 214 (the common gate/drain connection) of the bias FET 210 and the current source 218, in which case the filter FET's 206 control voltage Vctrl,filter would also be connected to the higher side of that offset voltage (at the current source).

The filter FET 206 is operated so as to act as a high-ohmic resistor and form a low-pass filter together with the filter capacitor 208. The bias FET 210 is used to generate the appropriate bias voltage for the gate of filter FET 206 in order to obtain a high-impedance drain-source resistance $R_{ds}$ of the filter FET 206. This operation can be achieved by applying a relatively small source-gate voltage across the filter FET 206 by feeding a small bias current into the bias FET 210. Various examples of how to bias the filter FET 206 (the resistive transistor device) at a low source-gate voltage, whilst advantageously still enabling tracking of this source-gate voltage with process spread, temperature or supply voltage changes are provided below. At least some of these examples may not require geometry rules relating to the filter FET 206 and the bias FET 210 to be satisfied. For example, the ratio of the width to the length of the filter FET 206 ($w_{Mres}/l_{Mres}$) need not necessarily be (much) smaller than the ratio of the width to the length of the bias FET 210 ($w_{Mctrl}/l_{Mctrl}$).

In some examples, are appropriate design choice for setting the impedance of the filter FET 206 via the voltage at its gate terminal ($V_{ctrl,filter}$) involves selecting (i) the size of offset voltage provided by the offset voltage source 220 and (ii) the geometries of the filter FET 206 and the bias FET 210. This can offer an additional degree of freedom when compared with any circuits that solely rely on the relative geometries of the filter FET 206 and the bias FET 210 to set the impedance of the filter FET 206. Such sole reliance on the relative geometries can be considered as a disadvantage in some examples because of the area required to implement such geometry relations. Indeed, one or more of the circuits disclosed in this document can use a sufficiently high offset voltage such that the filter FET 206 and the bias FET 210 can be dimensioned so that the ratio of the width to the length of the filter FET 206 ($w_{Mres}/l_{Mres}$) is greater than the ratio of the width to the length of the bias FET 210 ($M_{Mctrl}/l_{Mctrl}$). This extra degree and level of design freedom can be particularly beneficial in some applications.

The purpose of the offset voltage source 220 and/or the dimensioning of the filter FET 206 and the bias FET 210 is to create a source-gate voltage of the bias FET 210 that is close to, less than, or significantly below, the threshold voltage of the filter FET 206. Thus, use of devices that feature different threshold voltages $V_{th}$ is an option to realize the required offset voltage. In some examples, $V_{th,MRes}$ may be greater than $V_{th,Mctrl}$, for example: although $V_{th,MRes}$ may be less than $V_{th,Mctrl}$ if other circuit parameters (such as an offset provided in the buffer 216) are set such that overall the control voltage $V_{ctrl,filter}$ provided by means of the bias FET 210 has the required relationship with the threshold voltage of the filter FET 206. The filter FET 206 and the bias FET 210 can be realized in many different ways, a number of examples of which are provided below.

Use of Different Types of Transistors for the Bias FET 210 and the Filter FET 206

Processes that feature transistors suited for the same supply voltage but with different threshold voltages ($V_{th}$), can be used to realise the offset voltage. In modern deep sub-micron CMOS processes, logic gates that are built for digital circuits can use transistors with different threshold voltages ($V_{th}$). The transistors can be optimized for speed (with a low $V_{th}$) or for low leakage/low power consumption (with a high $V_{th}$).

The different threshold voltages of the transistors can mean that, for the same transistor geometries:

The gate-source voltage required to obtain a certain drain current needs to be raised for a higher $V_{th}$ transistor when compared to a lower $V_{th}$ transistor; or For the same gate-source voltage (for example the supply voltage for digital circuits or switches), the transistor with the relatively lower $V_{th}$ delivers more current than the transistor with the higher $V_{th}$.

That is, the transistors could have the same or different geometries, but irrespective of what geometries are actually used, the transistors are of a different type such that if they did have the same geometries then the above bullet points would apply. Therefore, the bias FET 210 and the filter FET 206 can be considered as different types inasmuch as they deliver different output characteristics (e.g. drain current or gate-source voltage), even if the geometries of the two FETs are the same), with respect to the same input applied (e.g. gate-source voltage or drain current, respectively). Two FETs that have dissimilar geometries, but would have the same threshold voltage if they had the same geometries, are therefore not considered as different types of transistors. This difference of output characteristics is for example achieved with different pocket implants.

In many technologies, transistors for different voltage domains exist, for example ones for 1.8V and 3.3V, 1.2V and 2.5V or 3.3V and 5V operation. Typically, the ones for the higher supply voltage feature a thicker gate oxide and result in a higher threshold voltage (Vth). In such a case, the device with the thinner gate oxide can be suitable for the bias FET 210 and the device with the thicker gate oxide device can be suitable for the filter FET 206.

In some applications, the use of this option can depend upon the process features used to manufacture the transistors, and in particular may require adequate tracking between the two transistors in terms of variations with process spread or temperature changes.

Therefore, the bias FET 210 and the filter FET 206 can be considered different inasmuch as they have gate oxide layers with different thicknesses, they are suitable for different voltage domains, and/or they are configured to receive different supply voltage levels.

Transistors for different supply voltages can also feature different types and/or amounts of implants that are present in the substrate that forms the device. Combining the gate oxide of one supply voltage type with the implant of a different supply voltage type will create a new device with a different threshold voltage. For example, if one adds additional implants or oxides, one can also create such new devices and even tailor it to a specific application. Advantageously, this may be achievable without significantly increasing process costs. Such a new device with a different threshold voltage can be used in combination with a device of the original type (before the gate oxide is combined with a different implant).

By changing the implants, transistors with different threshold voltages (Vth) can be created. Also, advantageously, process variations related to the gate oxide thickness or gate-dimensions would track (be consistent) between the original and the modified device. In relation to the temperature gradient of two such devices, it has been observed that the $\Delta V_{th}$ remains almost constant over a wide temperature range. Thus, the $\Delta V_{th}$ can be used to create the required offset voltage.

As implants can be accurately controlled during the manufacturing process, there can be a good tracking/correspondence between the variations of the threshold voltages (Vth) of the filter FET 206 and the bias FET 210 with respect to temperature and/or manufacturing variations of for example the gate length. Also, the following scientific paper provides technical details of how such an offset voltage can be implemented: "*A new NMOS Temperature-Stable Voltage Reference*" by Robert Blauschild et. al., *IEEE Journal of Solid State Circuits*, Vol. SC-13, No. 6, December 1978.

Therefore, the bias FET 210 and the filter FET 206 can be considered different inasmuch as they have different types and or amounts of implants that are present in the substrate that forms the device. The geometries and gate oxide thicknesses of the bias FET 210 and the filter FET 206 can be the same as each other, or different.

Use of the Same Types of Transistors for the Bias FET 210 and the Filter FET 206:

In some examples, particularly those that include a buffer 216, use of the same type of transistors can also be used to provide the required offset voltage. For example, the well (which in this example is an Nwell, although in other examples it may be a Pwell) of the bias FET 210 can be biased at a lower potential than the source potential. The well (which in this example is an Nwell, although in other examples it may be a Pwell) of the bias FET 210 could be connected to the gate of the bias FET 210 (the node $V_{ctrl,filter}$ in FIG. 2a) resulting in a so-called dynamic threshold MOS transistor (DTMOST). Such DTMOSTs are described in more detail in "*Low-Power Bandgap References Featuring DTMOSTs*" by Anne-Johan Annema, *IEEE Journal of Solid State Circuits*, Vol. 34, No. 7, July 1999. The positive back-gate effect can result in a reduction of the source-gate voltage of the bias FET 210 and thereby lift up Vctrl,filter and bias the filter FET 206 such that it is high-ohmic.

Also, in some examples, the same types of transistors can be used for the bias FET 210 and the filter FET 206, but with different geometries. For example the ratio of the width to the length of the filter FET 206 can be different to the ratio of the width to the length of the bias FET 210.

As will be discussed in more detail below, if the filter bias "offset" is implemented by using a transistor with a standard threshold voltage for the bias FET 210 and a transistor with a high threshold voltage for the filter FET 206, the offset voltage (as represented by the offset voltage source 220) will be the difference between the two threshold voltage parameters, and for example may be of the order of 100 mV. In that case, the "offset" is the representation of the different transistor types; it is not realized by a specific additional circuitry. It will be appreciated that the actual values for the various components will depend on the process technology that is being used and the transistor geometries.

In some implementations, the buffer 216 shown in FIG. 2a can be considered as optional. That is, the bias FET 210 can be connected directly to the filter input terminal 202 (recalling that the offset voltage source 220 shown in FIG. 2a can be considered as illustrative of a difference in threshold voltages of the bias FET 210 and the filter FET 206) such that the bias current for the bias FET 210 is drawn from the signal received at the filter input terminal 202. This may be considered acceptable in some applications.

FIG. 2b shows a low-pass filter 200' that is very similar to the low-pass filter of FIG. 2a. Common features that have already been described with reference to FIG. 2a will not necessarily be described again here. In this example, the offset voltage source 220' is illustrated as part of the filter FET 206' (Mres) instead of the bias FET 210' (Mctrl). It will to be appreciated that the circuit of FIG. 2b can operate in the same way as the circuit of FIG. 2a. In addition to the above mentioned options, the offset voltage source 220' can be implemented by means of current sources and a resistor, where the voltage drop across the resistor would provide the offset voltage.

FIG. 3 shows another low-pass filter 300. Features that are in common with the circuit of FIG. 2a have been given corresponding reference numbers in the 300 series and will not necessarily be described again with reference to FIG. 3.

In FIG. 3, the offset voltage source 320 is illustrated as connected to the buffer op-amp inverting input terminal of the buffer 316. The offset voltage source 320 is shown as connected between the buffer op-amp inverting input terminal and a node that is connected to both (i) the buffer op-amp output terminal and the first bias FET conduction terminal 312 (the source terminal). The offset voltage source 320 of FIG. 3 can be considered as inside the buffer op-amp 316.

Figure 4:
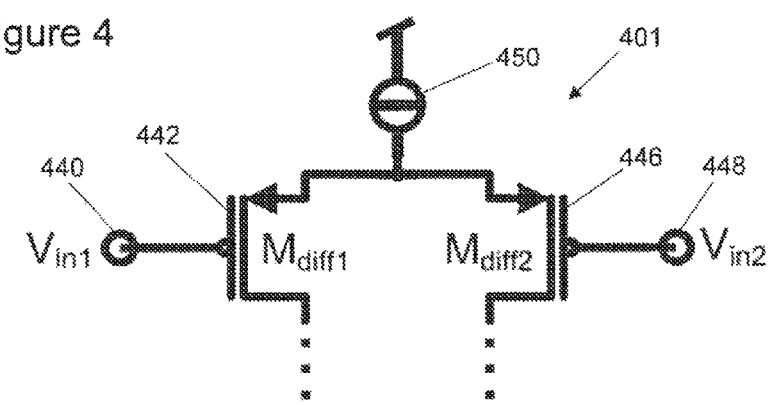
FIG. 4 illustrates a PMOS differential input stage 401, which can be part of the buffer of any one of FIGS. 2a, 2b and 3.

FIG. 4 illustrates a PMOS differential input stage 401 that can be part of the buffer of FIG. 3 that includes the offset voltage source. It will be appreciated that the buffer can use complementary input stages to achieve a full supply input range, and that the concepts described with reference to the differential input stage of FIG. 4 can apply equally to complementary input stages and rail-to-rail input stages.

The PMOS differential input stage 401 has a first input terminal 440 ($V_{in1}$) and a second input terminal 448 ($V_{in2}$). The first input terminal 440 and the second input terminal 448 correspond to the non-inverting and inverting input terminals of the buffer op-amp shown in FIG. 3. An example of the way in which the PMOS differential input stage 401 can be implemented with high and standard threshold voltage devices is described below with reference to FIG. 5.

Figure 5:
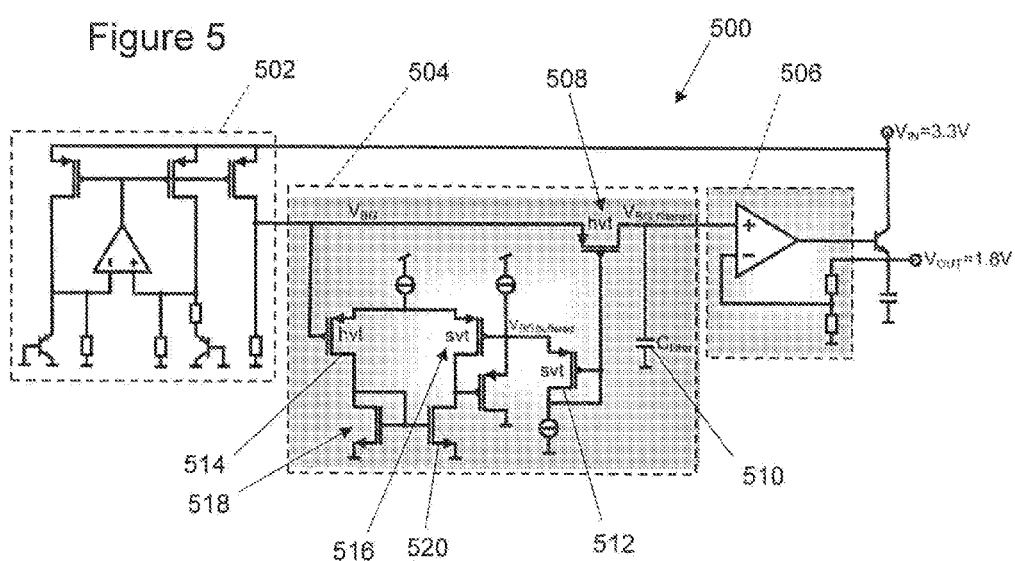
FIG. 5 illustrates another low noise low-dropout regulator.

The PMOS differential input stage 401 also has a first buffer FET 442, a second buffer FET 446 and a buffer current source 450. The buffer current source 450 provides a bias current to the first buffer FET 442 and the second buffer FET 446. The buffer current source 450 is connected to the conduction channel of the first buffer FET 442 (in this example the source terminal), and is also connected to the conduction channel of the second buffer FET 446 (in this example the source terminal). The drain terminals of the first buffer FET 442 and the second buffer FET 446 are connected to other components within the buffer, as is well known in the art. One example of how the drain terminals can be connected is shown in FIG. 5, as described below.

The gate terminal of the first buffer FET 442 is connected to first input terminal 440. The gate terminal of the second buffer FET 446 is connected to second input terminal 448.

The offset can be introduced by using a differential pair of buffer FETs that have different threshold voltages to each other. Alternatively, a current mirror load (such as an NMOS current mirror) with a non-unity transfer ratio (for example 5:1) could be used. That is, the current mirror may be asymmetrical.

An offset can be introduced into the input stage of the buffer in one or more of the following ways:

- Different geometries can be used for the first buffer FET 442 and the second buffer FET 446 that form the differential input pair. As discussed above, the geometries include the width and the length of the devices, and the ratio of the width to the length.
- The Nwell (not shown in FIG. 4) of one of the first buffer FET 442 and the second buffer FET 446 can be connected to a lower potential than the Nwell of the other FET in order to decrease the threshold voltage of that transistor. Similarly, connecting the Nwell to a higher potential will result in an increased threshold voltage, thus enabling the introduction of either positive or negative offsets. That is, the Nwells of the two FETs can be connected to different potentials. Such connections are different to circuits in which the Nwells are both tied to a common connection, for example the common source node or the supply.
- As discussed above with reference to FIG. 2a, different transistor types can be used for the first buffer FET 442 and the second buffer FET 446 in order to introduce an offset voltage $\Delta V_{th}$.
- An offset can be introduced by adding a resistor in-between the source of one of (i) the first buffer FET 442 and (ii) the second buffer FET 446, and the buffer current source 450. This approach may be particularly suitable for designs where current or area consumption is less critical and it can be considered acceptable to introduce additional resistors.
- An asymmetrical load can be connected to the drains of the first buffer FET 442 and the second buffer FET 446, as will be described briefly below with reference to FIG. 5.

FIG. 5 illustrates another LDO 500. The LDO 500 includes a bandgap voltage source 502, a low-pass filter 504 and a control loop 506. Specific features of the bandgap voltage source 502 and the control loop 506 will not be described here because they are well known in the art.

The low-pass filter 504 includes a filter capacitor 510, a filter FET 508 and a bias FET 512, which are similar to the components described with reference to FIG. 2a. In this example, an offset voltage is provided inside the bias FET 512 (which can also be referred to as being at the output of the buffer op-amp) because the filter FET 508 and the bias FET 512 have different threshold voltages. More particularly, the filter FET 508 has a high threshold voltage and the bias FET 512 has a standard threshold voltage.

The low-pass filter 504 also includes a first buffer FET 514 and a second buffer FET 516, which together provide a differential pair of FETs forming/constituting the input stage of the buffer, as described above with reference to FIGS. 3 and 4. In this example, an offset voltage is also provided inside the buffer op-amp because the first buffer FET 514 and the second buffer FET 516 have different threshold voltages. More particularly, the first buffer FET 514 has a high threshold voltage and the second buffer FET 516 has a standard threshold voltage.

Also in this example, the drain terminal of the first buffer FET 514 is connected to a first load FET 518. The drain terminal of the second buffer FET 516 is connected to a second load FET 520. The first load FET 518 and the second load FET 520 can be provided as a symmetrical current mirror with a 1:1 mirror ratio, which can be advantageous in some applications. Alternatively an asymmetrical current mirror can be used, thereby providing an asymmetrical load to the drains of the first buffer FET 514 and the second buffer FET 516. This asymmetrical loading would also introduce an offset.

It will be appreciated that the approaches of FIGS. 2 and 3 are not mutually exclusive. They can be combined as shown in FIG. 5 and different offset voltages can be chosen, which can result in even higher design flexibility.

Low noise and/or high PSRR (power supply rejection ratio) LDOs are used to deliver clean supply voltages for all kind of analogue signal processing. For example, audio systems, sensors, low jitter clock generators and RF-transceivers can be provided with one or more of the low-pass filters or LDOs described herein.

One or more of the examples disclosed herein can enable the generation of a low noise reference voltage for low noise voltage regulators. The circuits can be applied to a wide range of LDOs but can be especially well-suited for low noise, high PSRR and low quiescent current LDOs.

One or more of the examples disclosed in this document relate to a method of realizing a low-pass filter function for the implementation of a low noise reference voltage, for example for low noise high PSRR voltage regulators. Many ways have been found to provide a control voltage for biasing a transistor to become high-ohmic in order to realize the required low-pass filter function. The introduction of a buffer can secure that the reference input is not loaded by any bias current.

There is disclosed an LDO featuring a low-pass filter for removing noise from the reference voltage, and a method to bias a first transistor in its high-ohmic state consisting of a second transistor and a buffer. The buffer can introduce an offset voltage. The second transistor can have a different $V_{th}$ than the first transistor.

One or more of the circuits disclosed herein can be designed with NMOS and PMOS transistors and supply and ground exchanged with each other (complementary circuit implementation) if desirable. Also, the skilled person will appreciate from the above teachings that other methods can be used to create a buffer with an input or output related offset.

It will be appreciated that any components that are described or illustrated herein as being coupled or connected could be directly or indirectly coupled or connected. That is, one or more components could be located between two components that are said to be coupled or connected whilst still enabling the required functionality to be achieved.

It will be appreciated that any reference to "close to", "before", "shortly before", "after" "shortly after", "higher than", or "lower than", etc, can refer to the parameter in question being less than or greater than a threshold value, or between two threshold values, depending upon the context.

The invention claimed is:

1. A low-pass filter comprising:
a filter input terminal;
a filter output terminal;
a filter FET configured to provide a resistance between the filter input terminal and the filter output terminal;
a filter capacitor coupled between the filter output terminal and a reference terminal;
a bias FET configured to provide a bias voltage to the filter FET;
a buffer coupled between the filter input terminal and the bias FET, the buffer configured to source a bias current for the bias FET; and
an offset voltage source configured to contribute to the bias voltage provided to the filter FET.

2. The low-pass filter of claim 1, wherein the offset voltage source is configured to contribute to a source-gate voltage of the bias FET such that the source-gate voltage of the bias FET is less than a threshold voltage of the filter FET.

3. The low-pass filter of claim 1, wherein the ratio of the width to the length of the filter FET is the same or greater than the ratio of the width to the length of the bias FET.

4. The low-pass filter of claim 1, wherein a threshold voltage of the filter FET is greater than a threshold voltage of the bias FET.

5. The low-pass filter of claim 1, wherein the filter FET and the bias FET are different types of transistors.

6. The low-pass filter of claim 5, wherein the filter FET and the bias FET have gate oxide layers with different thicknesses.

7. The low-pass filter of claim 5, wherein the filter FET and the bias FET are configured to operate within a voltage domain.

8. The low-pass filter of claim 5, wherein the filter FET and the bias FET have different types and/or amounts of ion implants that are present in the substrate or well that forms the device.

9. The low-pass filter of claim 1, wherein the filter FET and the bias FET are the same type of transistors or wherein a well of the filter FET and a well of the bias FET are coupled to different potentials.

10. The low-pass filter of claim 1, wherein the offset voltage source is provided inside the buffer, the buffer comprises a differential input stage comprising a first buffer FET and a second buffer FET, and wherein a threshold voltage of the first buffer FET is different to a threshold voltage of the second buffer FET.

11. The low-pass filter of claim 10, wherein the first buffer FET and the second buffer FET are different types of transistors.

12. The low-pass filter of claim 1, wherein the bias FET comprises:
a bias FET control terminal; and
a bias FET conduction channel between a first bias FET conduction terminal and a second bias FET conduction terminal;
wherein the bias FET control terminal is coupled to the filter FET control terminal.

13. The low-pass filter of claim 1, wherein the offset voltage source is coupled to the second bias FET conduction terminal.

14. The low-pass filter of claim 1, wherein the offset voltage source is coupled in series between the buffer output terminal and the second buffer input terminal.

15. The low-pass filter of claim 1, wherein the buffer comprises a first buffer input terminal, a second buffer input terminal and a buffer output terminal, wherein the first buffer input terminal is coupled to the filter input terminal, the buffer output terminal is coupled to the second buffer input terminal, and the offset voltage source is coupled in series between buffer output terminal and the second bias FET conduction terminal.

16. A low-dropout regulator, comprising:
a low-pass filter including:
a filter input terminal;
a filter output terminal;
a filter FET, coupled to the input and output terminals, and configured to provide a resistance between the filter input terminal and the filter output terminal;
a filter capacitor coupled between the filter output terminal and a reference terminal;
a bias FET, coupled to the filter FET, and configured to provide a bias voltage to the filter FET;
a buffer coupled between the filter input terminal and the bias FET, the buffer configured to source a bias current for the bias FET; and
an offset voltage source, coupled to the buffer and bias FET, and configured to contribute to the bias voltage provided to the filter FET.

* * * * *